United States Patent [19]

Spitznagel et al.

[11] Patent Number: 4,971,650
[45] Date of Patent: Nov. 20, 1990

[54] METHOD OF INHIBITING DISLOCATION GENERATION IN SILICON DENDRITIC WEBS

[75] Inventors: John A. Spitznagel, Export; Raymond G. Seidensticker, Forest Hills; James P. McHugh, Wilkins Township, Allegheny County, all of Pa.

[73] Assignee: Westinghouse Electric Corp., Pittsburgh, Pa.

[21] Appl. No.: 411,129

[22] Filed: Sep. 22, 1989

[51] Int. Cl.[5] ............... C30B 15/22; C30B 15/34
[52] U.S. Cl. ............... 156/620.1; 156/DIG. 80; 156/DIG. 88; 422/248
[58] Field of Search ......... 156/619.1, 620.1, DIG. 80, 156/DIG. 88, 600, 617.1

[56] References Cited

U.S. PATENT DOCUMENTS

| | | | |
|---|---|---|---|
| 2,956,863 | 10/1960 | Goorissen | 422/249 |
| 3,278,274 | 10/1966 | Liebmann et al. | 422/249 |
| 3,298,795 | 1/1967 | Hamilton et al. | 422/249 |
| 4,014,656 | 3/1977 | Liebenzeder et al. | 422/249 |
| 4,282,184 | 8/1981 | Fiegl et al. | 422/249 |

OTHER PUBLICATIONS

R. Jayaram, J. A. Spitznagel, D. L. Meier, J. Greggi and M. Burke, Mat. Res. Soc. Symp. Proc. 82, 271 (1986).
S. O'Hara, JAP 35, No. 2, 409 (1964).
E. D. Jungbluth, JAP 36, No. 10, 3112 (1965).
T. N. Tucker and G. H. Schwuttke, Appl. Phys. Lett. 9, No. 6, 219 (1966).

*Primary Examiner*—Gary P. Straub
*Assistant Examiner*—Stephen G. Kalinchak
*Attorney, Agent, or Firm*—Fred J. Baehr, Jr.

[57] ABSTRACT

A method of tailoring the heat balance of the outer edge of the dendrites adjacent the meniscus to produce thinner, smoother dendrites, which have substantially less dislocation sources contiguous with the dendrites, by changing the view factor to reduce radiation cooling or by irradiating the dendrites with light from a quartz lamp or a laser to raise the temperature of the dendrites.

10 Claims, 2 Drawing Sheets

METHOD OF INHIBITING DISLOCATION GENERATION IN SILICON DENDRITIC WEBS

GOVERNMENT CONTRACT

This invention was conceived or first reduced to practice in the course of, or under contract number XARA-73254-AL-CE/02-6639 between Westinghouse Electric Corporation and the U.S. Government, represented by the Department of Energy.

BACKGROUND OF THE INVENTION

The invention relates to a method of making a dendritic web of silicon forming a continuous ribbon consisting of a single silicon crystal and more particularly to a method of inhibiting the formation of dislocations in the dendrites adjacent the web.

Prediction and control of dislocation generation during crystal growth is a key task in defining attainable regimes of ribbon growth rate and solar cell efficiency. This aspect of materials engineering poses a formidable challenge since no complete field theory for dislocation source operation and defect accumulation or annihilation exists at present. Consequently, semi-empirical and phenomenological models must be constructed.

A qualitative model, which appears to be consistent with most of the data on dislocation density, distribution, Burger's vector, and residual stress is as follows: dislocation sources located in the bounding dendrites or near the external {111} surface of the web generate dislocations when thermal stresses exceed approximately 2 MPa over a distance of zero to approximately 3 cm from the growth front. Dislocation generation may also occur in sections of the ribbon lying within 4 to 7 cm from the growth front, if larger critical resolved shear stresses exist before the crystal has cooled below approximately 1000° K. Most of the dislocations glide into the web until they encounter the internal twin boundaries or a portion of the liquid-solid interface. A twin boundary is a barrier to dislocation motion and results in dislocation pile-ups. These can undergo thermal rearrangement to form low angle polygonal boundaries or higher angle subgrain boundaries which usually terminate crystal growth and reduce solar cell efficiency. Dislocations which intersect the solid-liquid interface are subsequently propagated as growth steps as atoms attached to the growing web. These grown-in dislocations are aligned along the [211] growth direction and are usually heavily decorated with $SiO_x$ precipitate particles.

X-ray transmission topographs indicate that dislocation sources in the bounding dendrites can inject segments of expanding dislocation loops into a silicon web crystal during growth. Darkly imaging features near the outside edge of the dendrites have been identified as local stress centers by a variety of techniques including Sirtl etch pitting of bevel polished dendrites, X-ray diffraction analysis, and transmission electron microscopy observations of bend contours associated with these features. The occurrence of similar stress centers in as grown web crystals was reported in the early days of web research by S. O'Hara, in his paper entitled "Dislocation in Webs of Germanium and Silicon" and in T. N. Tucker and G. H. Schwuttke in their paper entitled "Growth of Dislocation-Free Silicon Web Crystals."

SUMMARY OF THE INVENTION

Among the objects of the invention may be noted the provision of a method for inhibiting the formation of dislocations in dendritic webs which affect the growth and electrical efficiency of crystals formed.

In general, a method of inhibiting dislocation formation in dendrites of a dendritic web ribbon drawn from a molten pool disposed in a furnace, when performed in accordance with this invention, comprises the steps of drawing the dendritic web ribbon from the molten pool at a controlled rate and controlling the heat balance of a small portion of the dendritic web at the outer edges of the dendrites adjacent the solid-liquid interface, whereby the dendritic edges of the web are thinner, smoother and dislocation formation in the dendrites is substantially reduced.

BRIEF DESCRIPTION OF THE DRAWINGS

The invention as set forth in the claims will become more apparent by reading the following detailed description in conjunction with the accompanying drawings, wherein like reference numerals refer to like parts through the drawings and in which:

DESCRIPTION OF THE PREFERRED EMBODIMENT

Figure 1:
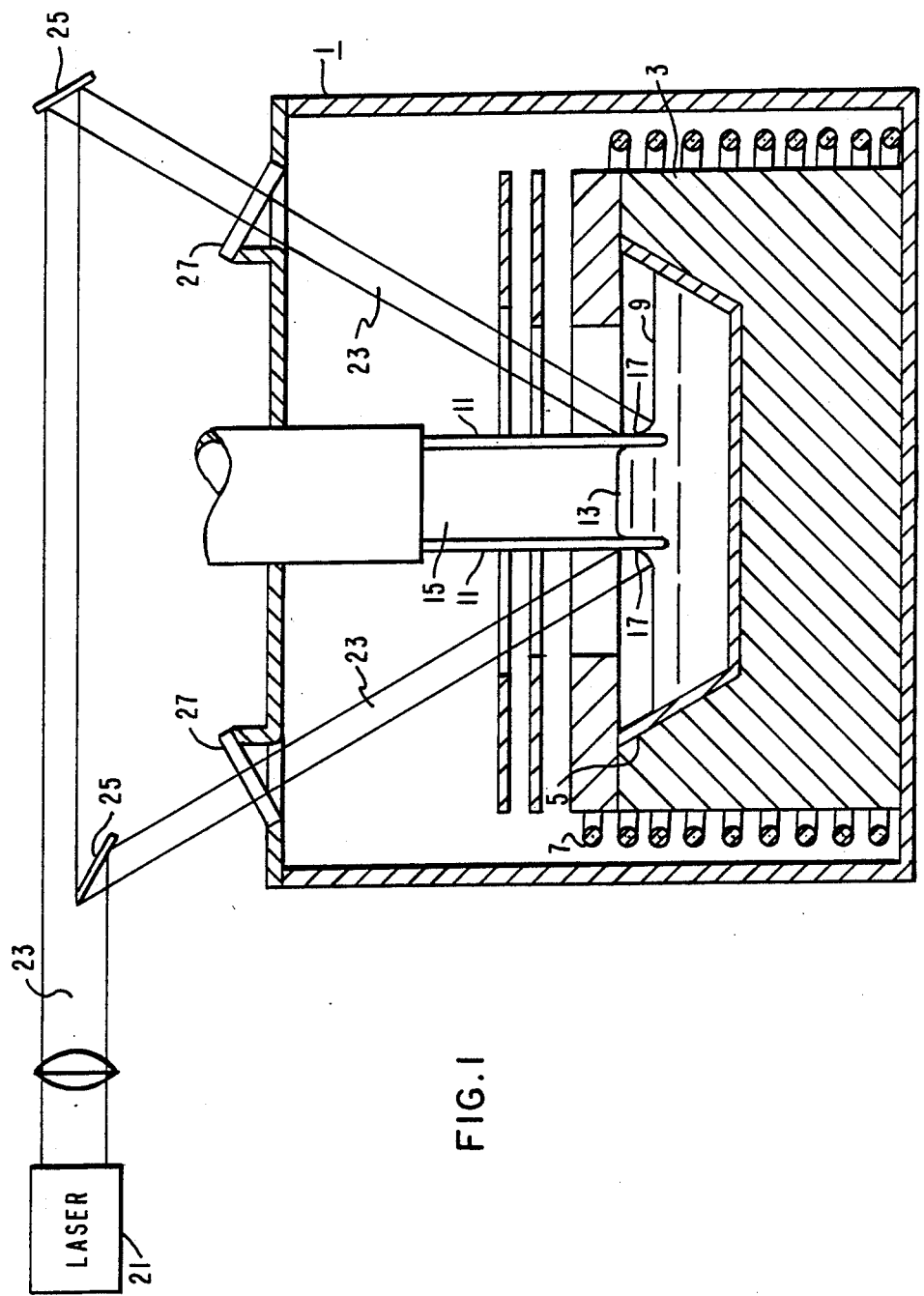
FIG. 1 is a schematic view of a system utilized to practice this invention.

Referring now to the drawings in detail and in particular to FIG. 1 there is shown a furnace 1 which contains a molybdenum susceptor 3 having a quartz crucible 5 disposed therein. An electrical induction heating coil 7 encircles the susceptor 3 to supply the energy necessary to melt silicon placed in the crucible 5 to form a molten pool 9 of silicon. A dendritic seed crystal of silicon (not shown) is lowered into the center of the molten pool, which is subcooled, and withdrawn initiating the growth of a crystal formed with a dendrite 11 on each longitudinal edge. The dendrites extend into the subcooled portion of the melt and as they are withdrawn a liquid meniscus 13 forms between the dendrites 11 and solidifies as a dendritic web or ribbon 15 as the dendrites 11 are slowly pulled in a direction away from the pool 9. This process is well known and so are the imperfections and discontinuities adjacent the dendrites referred to as dislocations by S. O'Hara in his paper entitled "Dislocations of Germanium and Silicon," E. D. Jungbluth in his paper entitled "Direct Observation of Dislocations in Silicon Web Crystals" and T. N. Tucker and G. H. Schwuttke in their paper entitled "Growth of Dislocation-Free Silicon Web."

Through X-ray transmission topographs, dark imaging features near the outside edge of the dendrites have been identified as local stress centers by a variety of techniques including Sirtl etch pitting of beveled polished dendrites, X-ray diffraction analysis and Transmission Electron Microscopy observations of bend contours associated therewith. Thus, it was postulated that these observations are consistent with a mechanism of entrainment of liquid Si droplets between the facets at the surface of the dendrite 11. Freezing of the droplets above the meniscus 13 can result in highly localized thermal stresses, since the droplets serve as point heat sources during dissipation of the latent heat of fusion. There is no evidence to suggest that the droplets are associated with impurity effects, since they have been observed over large ranges of doping concentrations and feed source materials. Dispersive energy X-ray measurements also indicate no chemical compositional differences between the stress centers and the surrounding matrix. Having analyzed these conditions and their occurrence, a method has been devised to smooth the dendrites 11, reduce their thickness and decrease the possibility of entraining drops of molten silicon at sufficiently high thermal loading to allow increased melt levels and pull speeds by controlling or tailoring the heat balance of a small area 17 on the outer edge of the dendrites 11 adjacent the solid-liquid interface or adjacent the meniscus 13 as the dendrites 11 are pulled from the pool 9.

This controlling or tailoring of the heat balance can be accomplished by irradiation of the dendrites 11 with a laser 21 or quartz lamp (not shown) or by changes in view factor, which alter radiation cooling, thus reducing the heat loss to this critical small area 17 at the edge of the dendrites 11 to reduce the temperature gradient and local stress around existing droplets as they solidify.

In the embodiment shown in FIG. 1 the laser 21 produces a beam of coherent light 23, which is focused, split and directed by mirrors 25 through angled quartz windows 27 to the small area 17 about 3 mm in diameter on the outer edge of the dendrites 11 adjacent the liquid-solid interface or meniscus 13. Power levels generally in the range of 50 to 300 milliwatts are sufficient to form smoother, thinner dendrites 11 with substantial reductions in the number of dislocations, but these values could be changed depending on the pull rate and melt level.

Figure 2:
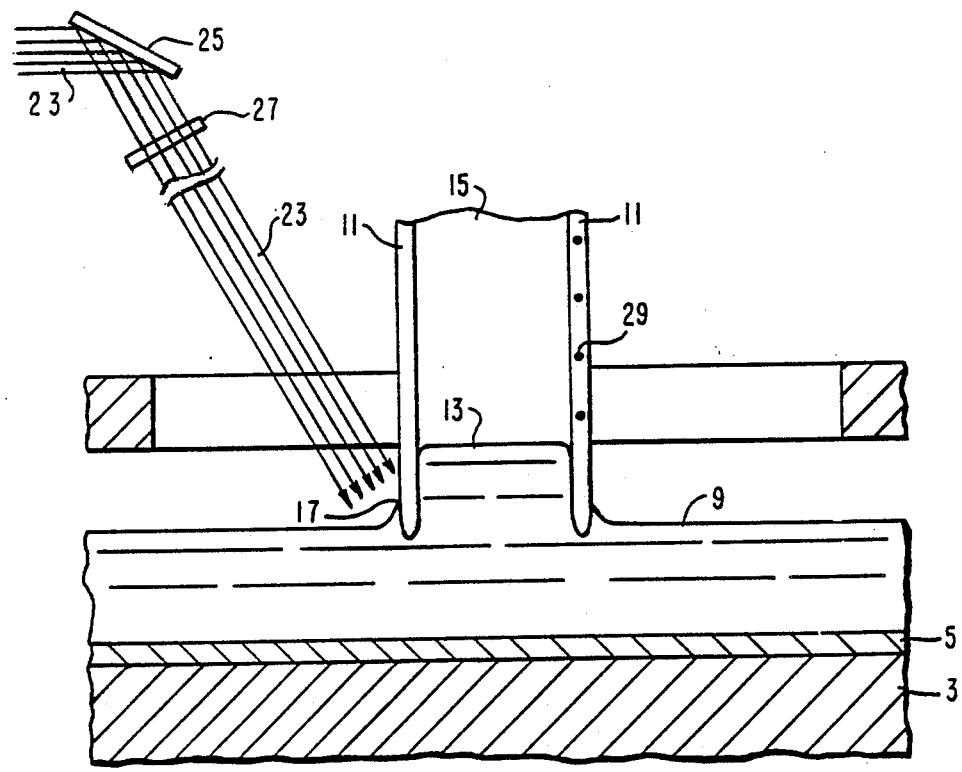
FIG. 2 is a schematic view of a controlled test utilized to prove the results valid.

FIG. 2 shows a schematic view of a test in which only one dendrite 11 was irradiated with a Spectra Physics 164 Argon Laser (not shown). Inspection of the dendritic web 15 by X-ray topograph indicated that the irradiated dendrite 11 was thinner, smoother and more defect free than the unheated dendrite 11. The Argon Laser was selected because of the ease of focusing and control of the beam power and because of the fact that the light would be absorbed within the first micron or so of the outer edge of the dendrite. The optic path, set by mirrors 25 to pass through the angled window 27 in the furnace lid, permitted dynamic positioning of the beam 23 on the edge of one of the dendrites 11 during web growth. As the crystals were being grown, one dendrite 11 was irradiated at power levels of 100, 200 and 300 milliwatts beam power, however, if other types of lasers are used, power levels of 50 milliwatts or lower may be sufficient, particularly if attention is directed to the radiation of heat from this area of the dendrites 11. The beam 23 was incident on the outer edge of the dendrite 11 just above the meniscus 13 with the spot diameter 17 being approximately 3 mm. X-ray topograph on the crystal with a heated and unheated dendrites 11 showed the heated dendrite 11 was thinner, smoother and had substantially less defects 29 adjacent thereto than the unheated dendrite 11 even at a power level as low as 100 milliwatts. The ability to tailor the heat flow at the outer edge of the dendrites 11 adjacent the meniscus 13 will enhance ability to grow substantially defect free silicon web crystals at higher melt levels and higher growth speeds and produce higher quality crystals with improved electrical characteristics.

While the preferred embodiments described herein set forth the best mode to practice this invention presently contemplated by the inventors, numerous modifications and adaptations of this invention will be apparent to others skilled in the art. Therefore, the embodiments are to be considered as illustrative and exemplary and it is understood that numerous modifications and adaptations of the invention as described in the claims will be apparent to those skilled in the art. Thus, the claims are intended to cover such modifications and adaptations as they are considered to be within the spirit and scope of this invention.

What is claimed is:

1. A method of inhibiting dislocation formation in adjacent dendrites of a dendritic web ribbon drawn from a molten pool disposed in a furnace comprising the steps of drawing the dendritic web ribbon from the molten pool at a controlled rate and controlling the heat balance of a small portion of the dendrites by irradiating with a light source a spot on each dendrite adjacent the solid-liquid interface in such a manner to control the shape of the dendritic edges and to inhibit dislocation formation adjacent thereto.

2. The method of wherein the spot is about 3 mm in diameter adjacent the meniscus on each dendrite.

3. The method of claim 1, wherein the light source is a laser.

4. The method of claim 3, wherein the energy applied to the laser is in the range of 50–300 milliwatts.

5. The method of claim 3, wherein the laser is an argon laser.

6. The method of claim 3, and further comprising the steps of focusing the light from the laser, providing a quartz window in the furnace and directing the light through said window to said spots utilizing mirrors.

7. The method of claim 1, wherein the source of heat is a laser and includes the step of directing a beam of light from the laser so it is incident on the outer edge of the dendrite.

8. The method of claim 1, wherein the step of controlling the heat balance of the small portion of the dendrites comprises adding heat utilizing a laser and includes the step of directing a beam of light from the laser so that the beam is incident on the outer edge of the dendrites.

9. The method of claim 7, wherein the irradiated spots absorb the heat energy generally within no more than a few microns of the surface.

10. The method of claim 1, wherein the heat supplied to the spots is absorbed within no more than a few microns of the surface.

* * * * *